(12) United States Patent
Gao et al.

(10) Patent No.: US 12,419,001 B2
(45) Date of Patent: Sep. 16, 2025

(54) CABLE THREADING COMPONENT AND SEALING BOX

(71) Applicant: Kidde Fire Protection, LLC, Bradenton, FL (US)

(72) Inventors: Yuan Gao, Changan Town (CN); Chunlei Qu, Changan Town (CN)

(73) Assignee: KIDDE FIRE PROTECTION, LLC, Bradenton, FL (US)

( * ) Notice: Subject to any disclaimer, the term of this patent is extended or adjusted under 35 U.S.C. 154(b) by 137 days.

(21) Appl. No.: 18/301,236

(22) Filed: Apr. 16, 2023

(65) Prior Publication Data

US 2023/0354540 A1    Nov. 2, 2023

(30) Foreign Application Priority Data

Apr. 27, 2022 (CN) .......................... 202210450517.5

(51) Int. Cl.
*H05K 5/06* (2006.01)
*H01B 17/30* (2006.01)
*H02G 3/22* (2006.01)

(52) U.S. Cl.
CPC ............ *H05K 5/069* (2013.01); *H01B 17/30* (2013.01)

(58) Field of Classification Search
CPC .......... H02G 3/08; H02G 3/081; H02G 3/085; H02G 3/088; H02G 3/22; H05K 5/00; H05K 5/02; H05K 5/0208; H05K 5/0247; H05K 5/03; H01B 17/30
USPC ............. 174/50.5, 480, 50, 650, 652, 137 R, 174/138 R, 152 R; 220/3.2–3.9, 4.02; 248/49, 68.1, 56
See application file for complete search history.

(56) References Cited

U.S. PATENT DOCUMENTS

| | | | | |
|---|---|---|---|---|
| 1,952,695 A | * | 3/1934 | Webb ................... | H01B 17/308 285/47 |
| 3,254,153 A | * | 5/1966 | Kohler ................. | H02G 15/192 174/91 |
| 5,529,508 A | * | 6/1996 | Chiotis .............. | H01R 13/5216 439/204 |

(Continued)

FOREIGN PATENT DOCUMENTS

| | | | | |
|---|---|---|---|---|
| DE | 202010010438 U1 | * | 11/2010 | ............. H02G 3/085 |
| EP | 2736137 A1 | | 5/2014 | |
| EP | 3934037 A2 | | 1/2022 | |

OTHER PUBLICATIONS

European Search Report for Application No. 23167625.5, Issued Sep. 22, 2023, 8 Pages.

*Primary Examiner* — Angel R Estrada
(74) *Attorney, Agent, or Firm* — CANTOR COLBURN LLP

(57) ABSTRACT

The present application provides a cable threading component and a sealing box. The cable threading component comprises: a substrate comprising a plurality of through holes; a sealing sheet comprising a plurality of sealing holes corresponding to positions of the through holes on the substrate; and a mounting plate comprising a plurality of guide holes corresponding to positions of the through holes on the substrate; wherein, when the mounting plate is attached to the substrate, the sealing sheet is pressed between the substrate and the mounting plate, and the plurality of through holes of the substrate, the plurality of sealing holes of the sealing sheet, and the plurality of guide holes of the mounting plate are aligned to form threading holes.

18 Claims, 8 Drawing Sheets

(56) References Cited

U.S. PATENT DOCUMENTS

| | | | | |
|---|---|---|---|---|
| 5,726,392 A * | 3/1998 | Farr | ......................... | H02G 3/16 |
| | | | | 439/587 |
| 6,527,302 B1 * | 3/2003 | Gault | ..................... | F16L 41/03 |
| | | | | 285/125.1 |
| 6,867,371 B2 * | 3/2005 | Daoud | ................. | G02B 6/4428 |
| | | | | 174/151 |
| 7,259,337 B1 * | 8/2007 | Gretz | ....................... | H02G 3/06 |
| | | | | 220/241 |
| 7,446,266 B1 * | 11/2008 | Gretz | .................... | H02G 3/083 |
| | | | | 220/241 |
| 8,642,885 B2 * | 2/2014 | Davila | ................... | H02G 3/086 |
| | | | | 174/50 |

\* cited by examiner

CABLE THREADING COMPONENT AND SEALING BOX

CROSS REFERENCE TO A RELATED APPLICATION

The application claims priority to Chinese Patent Application No. 202210450517.5 filed Apr. 27, 2022, and all the benefits accruing therefrom under 35 U.S.C. § 119, the contents of which in its entirety are herein incorporated by reference.

FIELD OF THE INVENTION

The present invention relates to the field of sealing devices, in particular to a cable threading component and a sealing box.

BACKGROUND OF THE INVENTION

In humid environments, such as subways and basements, it is necessary to use waterproof boxes to protect certain electrical components, such as alarm devices (e.g., manual alarm switches), fire hydrant switches, I/O modules, and the like. Since electrical components need to be connected to external components using cables, cable sockets are provided for the waterproof boxes. A common cable socket is cable gland, which has a dustproof and waterproof rating of IP68. However, for cost and structural considerations, a single cable gland (also known as cable waterproof joint or cable threading head) is often used, where a plurality of cables are intertwined and then threaded through the single cable gland. A single cable gland is only applicable to cable diameters within a certain range, such as 8 mm to 14 mm. When there are more or fewer cables, a single cable gland is unable to be used or its protective performance deteriorates significantly. For example, when a single cable has a diameter of 3 mm, it is necessary to intertwine three to five cables to pass through the single cable gland. However, when there are only two cables or there are more than five cables, it is difficult to install or the waterproof performance will not be ideal. In addition, the structure of the cable gland is relatively complex, and the installation steps are relatively cumbersome, as it is necessary to rotate the cover of the cable gland twice.

SUMMARY OF THE INVENTION

The object of the present application is to solve or at least alleviate the problems existing in the prior art.

According to one aspect, a cable threading component is provided. The cable threading comprises: a substrate, comprising a plurality of through holes; a sealing sheet, comprising a plurality of sealing holes corresponding to positions of the through holes on the substrate; and a mounting plate, comprising a plurality of guide holes corresponding to positions of the through holes on the substrate; wherein, when the mounting plate is attached to the substrate, the sealing sheet is pressed between the substrate and the mounting plate, and the plurality of through holes of the substrate, the plurality of sealing holes of the sealing sheet, and the plurality of guide holes of the mounting plate are aligned to form threading holes. The guide hole has an inner diameter larger than that of the through hole to allow cable to pass through the threading hole from the side of the mounting plate; wherein the sealing hole comprises a tubular portion extending into the through hole, and a sealing core is provided on an inner side of the tubular portion, so that the sealing hole is closed before threading, and the sealing core peels off and the position of the sealing core is occupied by the cables when the cables pass through.

In one or more embodiments of the cable threading component, each sealing hole of the sealing sheet comprises an inlet end that abuts the through hole, a tubular portion extending into the through hole, and a transition portion between the inlet end and the tubular portion.

In one or more embodiments of the cable threading component, the transition portion gradually tapers from the inlet end to the tubular portion.

In one or more embodiments of the cable threading component, the plurality of threading holes comprise more than 4 threading holes. Optionally, the plurality of threading holes comprise more than 6 threading holes.

In one or more embodiments of the cable threading component, an outer diameter of the tubular portion is smaller than an inner diameter of the through hole. Optionally, the outer diameter of the tubular portion is 0.5 mm-1.5 mm smaller than the inner diameter of the through hole. Optionally, the length of the tubular portion is greater than 80% of the inner diameter of the tubular portion.

In one or more embodiments of the cable threading component, the sealing core comprises a central reinforcing portion and an annular thinning portion on the outer ring of the central reinforcing portion. Optionally, the central reinforcing portion is in a convex shape in the cross section.

In one or more embodiments of the cable threading component, the sealing sheet has an outer circumferential sealing ring surrounding the plurality of sealing holes on the side facing the substrate, and the mounting plate comprises an outer circumferential protrusion corresponding to the outer circumferential sealing ring and inner protrusions surrounding the respective sealing holes on the side facing the sealing sheet. The outer circumferential protrusion and the inner protrusions abut against the sealing sheet.

In one or more embodiments of the cable threading component, the substrate has a recess to accommodate the sealing sheet and the mounting plate. Optionally, the mounting plate, the sealing sheet, and the substrate have bolt holes in the corresponding positions, and the mounting plate is fixed to the substrate by bolts.

In one or more embodiments of the cable threading component, the sealing sheet is made of silicone rubber or thermoplastic polyurethane rubber, and the Shore A hardness of the sealing sheet is in the range of 55° to 65°.

In one or more embodiments of the cable threading component, the tubular portion of the sealing hole provides IP66 level dust and water resistance when its inner diameter is stretched to 108% to 170% by a cable.

A sealing box is also provided, which comprises the cable threading component according to the various embodiments.

The cable threading component and the sealing box according to the embodiments of the present invention can provide appropriate waterproof and sealing performance, and are easy for the installation of cables.

BRIEF DESCRIPTION OF THE DRAWINGS

With reference to the accompanying drawings, the disclosure of the present application will become easier to understand. Those skilled in the art would readily appreciate that these drawings are for the purpose of illustration, and are not intended to limit the protection scope of the present application. In addition, in the figures, similar numerals are used to denote similar components, where.

DETAILED DESCRIPTION OF EMBODIMENT(S) OF THE INVENTION

Figure 1:
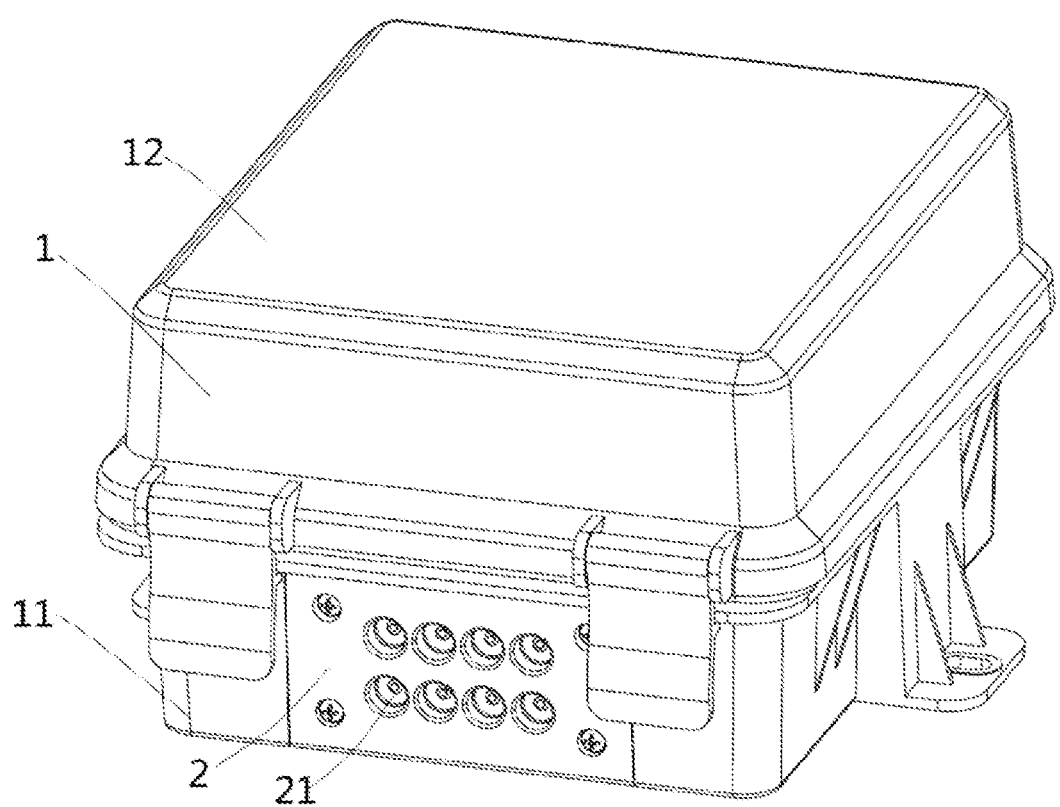
FIG. 1 shows a perspective view of a sealing box according to an embodiment of the present invention.

FIG. 1 shows a sealing box according to an embodiment of the present invention. The sealing box 1 comprises an upper housing 12 and a lower housing 11, wherein the upper housing 12 can be rotated relative to the lower housing 11 for opening. A sealing element is provided between the upper housing 12 and the lower housing 11 to provide a sealing effect when the two are in a closed state. The lower housing 11 is provided with a cable threading component 2 according to an embodiment of the present invention, where cables can be inserted into the sealing box 1 through threading holes 21 of the cable threading component 2 to maintain the sealing performance of the sealing box 1. In the illustrated embodiment, a total of eight threading holes 21, i.e., two rows, four threading holes 21 in each row, are provided. Each threading hole 21 can be used for a cable ranging from 2.5 mm to 4 mm. Since the respective threading holes are independent and are initially in a sealed state as detailed below, the cable threading component 2 is applicable to a variety of cable types and cable numbers. Compared to the range of cable diameters from 8 mm to 14 mm for a single cable gland, the embodiment in FIG. 1 of the present application provides a range of the total cable diameters from 2.5 mm to 32 mm, and can accommodate any number of cables from 1 cable to 8 cables. In alternative embodiments, more or fewer threading holes 21 may be arranged, and the layout of the threading holes 21 may also be changed. However, in general, the number of threading holes 21 is greater than 4, or greater than 6, so as to provide a wide range of applicability. The sealing box 1 can be used to accommodate various electrical components intended to be installed in a dry environment, including but not limited to alarm buttons, and the like. It should be appreciated that the cable threading component 2 according to the embodiment of the present invention is not limited to be used for sealing boxes, but can also be used for other sealing structures, as long as such sealing structures include plates, walls, or partitions through which cables need to pass, such as internal partitions for containers to separate sealing areas, and the like.

Figure 2:
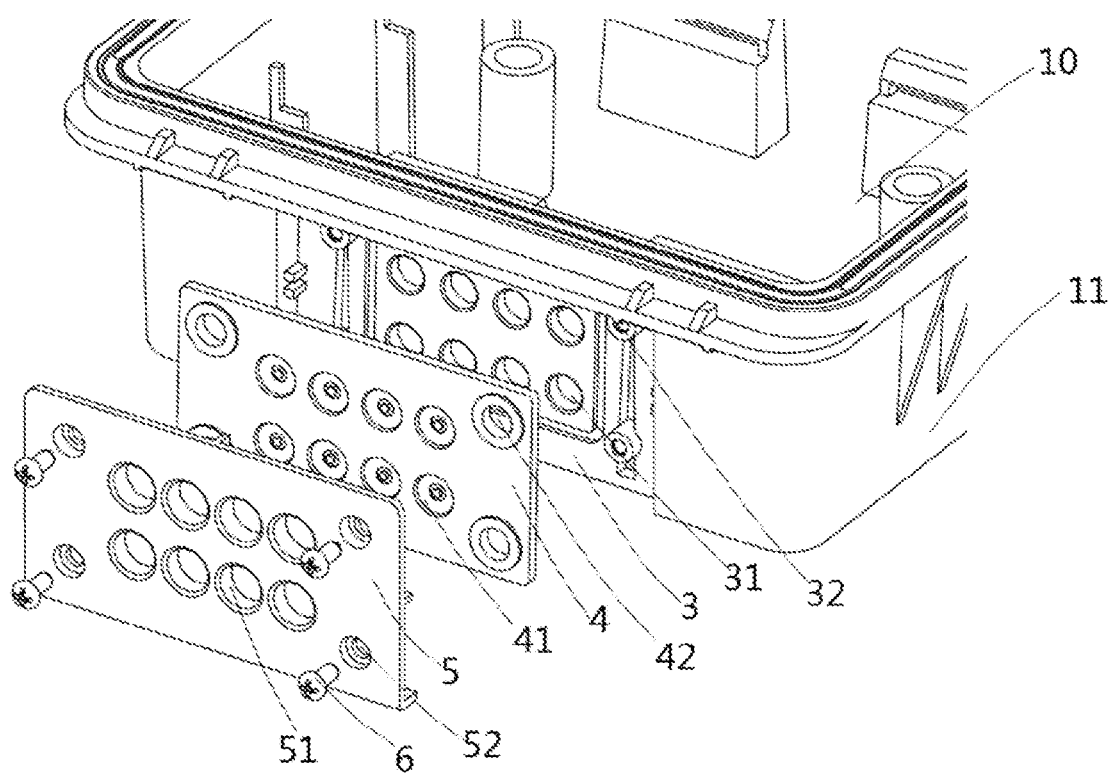
FIG. 2 shows an exploded view of a sealing box in an open state according to an embodiment of the present invention.

Referring to FIG. 2, the sealing box 1 is in an open state and the cable threading component 2 is shown in an exploded view. The cable threading component 2 comprises: a substrate 3 comprising a plurality of through holes 31; a sealing sheet 4 comprising a plurality of sealing holes 41 corresponding to the positions of the through holes 31 on the substrate 3; and a mounting plate 5 comprising a plurality of guide holes 51 corresponding to the positions of the through holes 31 on the substrate 3. When the mounting plate 5 is attached to the substrate 3, the sealing sheet 4 is pressed between the substrate 3 and the mounting plate 5, and the plurality of through holes 31 of the substrate 3, the plurality of sealing holes 41 of the sealing sheet 4, and the plurality of guide holes 51 of the mounting plate 5 are aligned to form the threading holes 21 shown in FIG. 1. The guide hole 51 has an inner diameter larger than that of the through hole 31, so as to allow the cable to pass through the threading hole 21 from the side of the mounting plate (i.e., the outer side of the sealing box) and connect to the electrical component inside the sealing box 1. In some embodiments, the substrate 3 may have a recess to accommodate the sealing sheet 4 and the mounting plate 5, so that the sealing sheet 4 and the mounting plate 5 are flush with other parts of the substrate 3 when installed. In some embodiments, the mounting plate 5, the sealing sheet 4, and the substrate 3 have bolt holes 52, 42, 32 in the corresponding positions, where the mounting plate 5 is fixed to the substrate 3 through bolts 6. In some embodiments, the sealing sheet 4 may not have bolt holes, where the sealing sheet 4 is positioned through other features. In some embodiments, the sealing sheet 4 and mounting plate 5 are rectangular in shape, with four bolt holes at the respective four corners.

Figure 3:
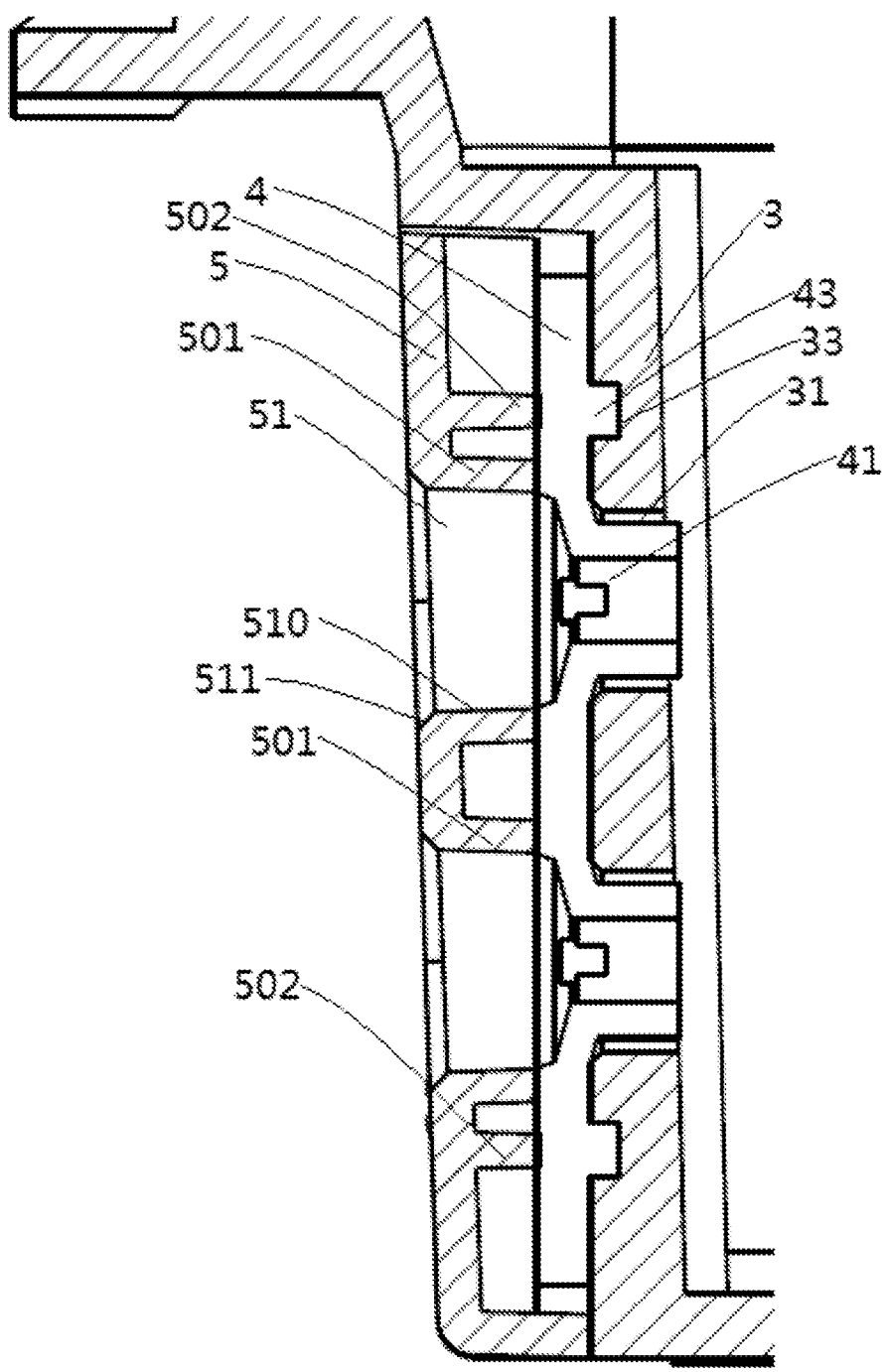
FIG. 3 shows a cross-sectional view of a cable threading component of a sealing box according to an embodiment of the present invention.
Figure 4:
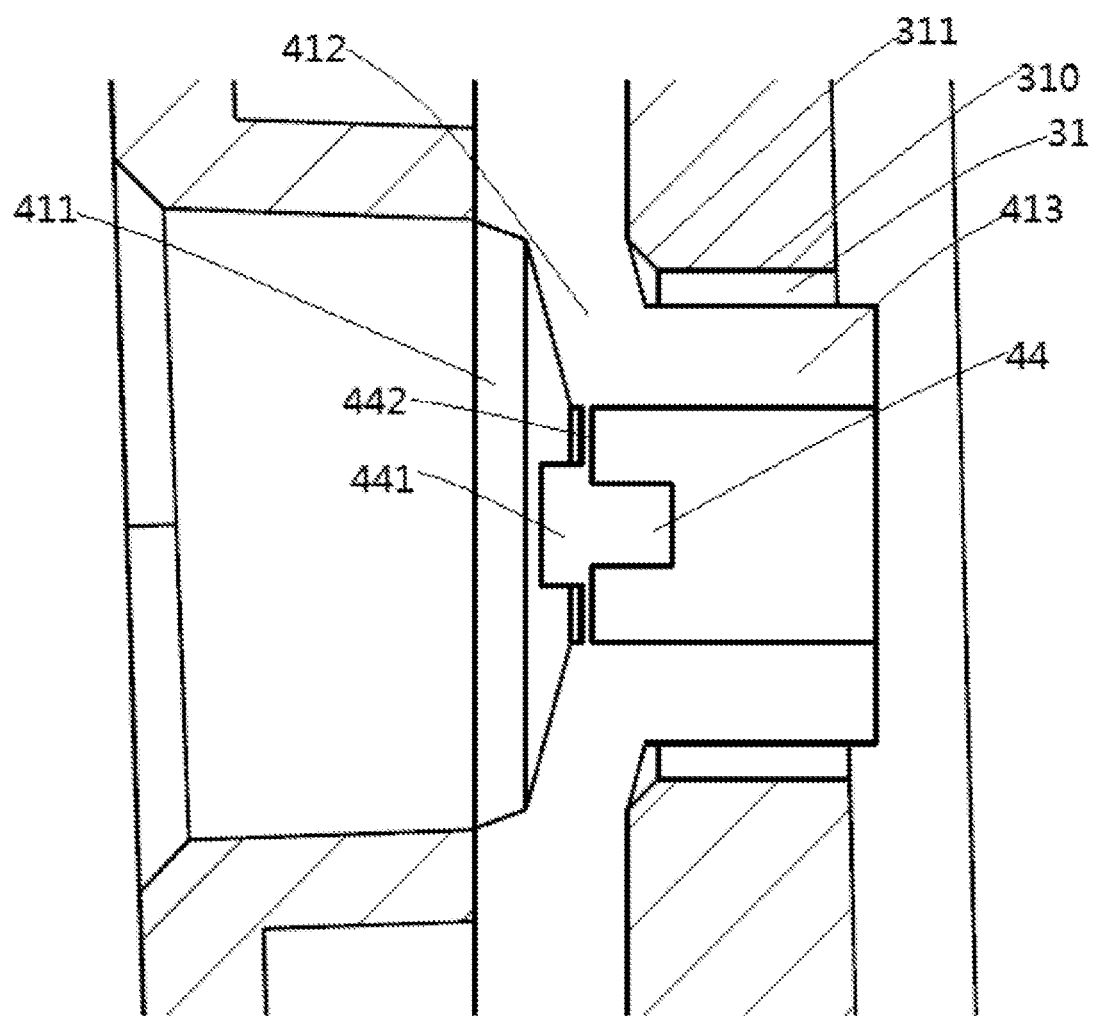
FIG. 4 shows a partially enlarged cross-sectional view of a cable threading component of a sealing box according to an embodiment of the present invention.
Figure 5:
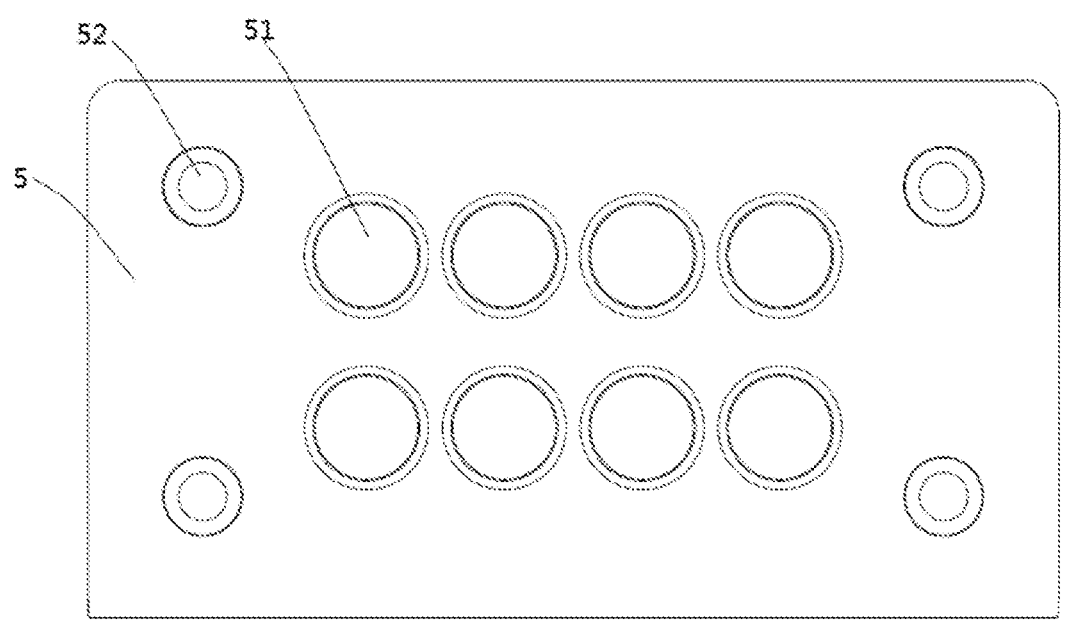
FIGS. 5 and 6 show front and back views of a mounting plate according to an embodiment.
Figure 6:
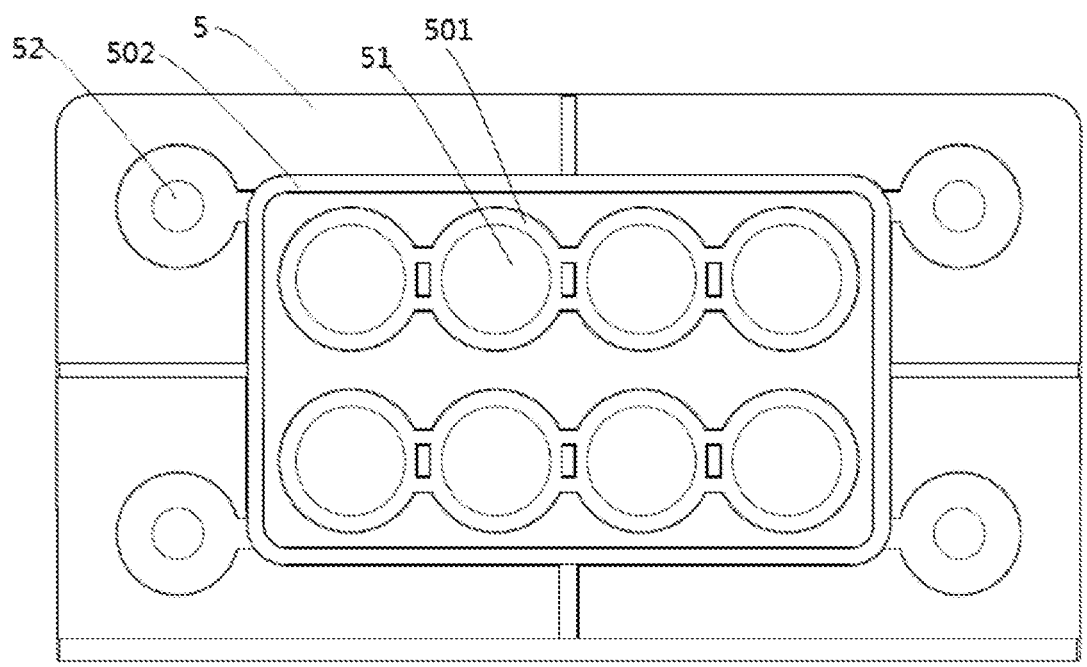
Figure 7:
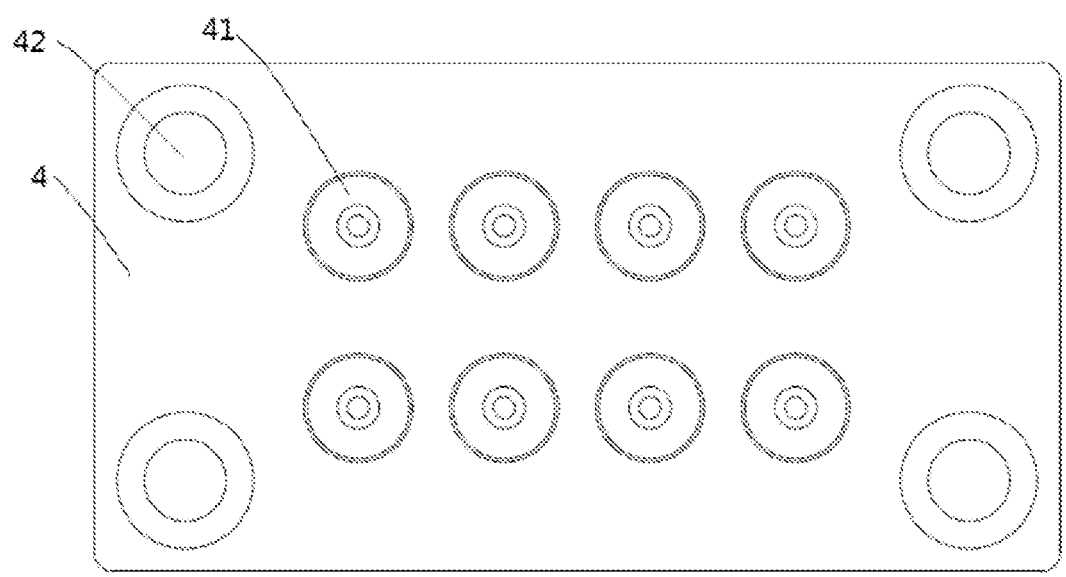
FIGS. 7 and 8 show front and back views of a sealing sheet according to an embodiment.
Figure 8:
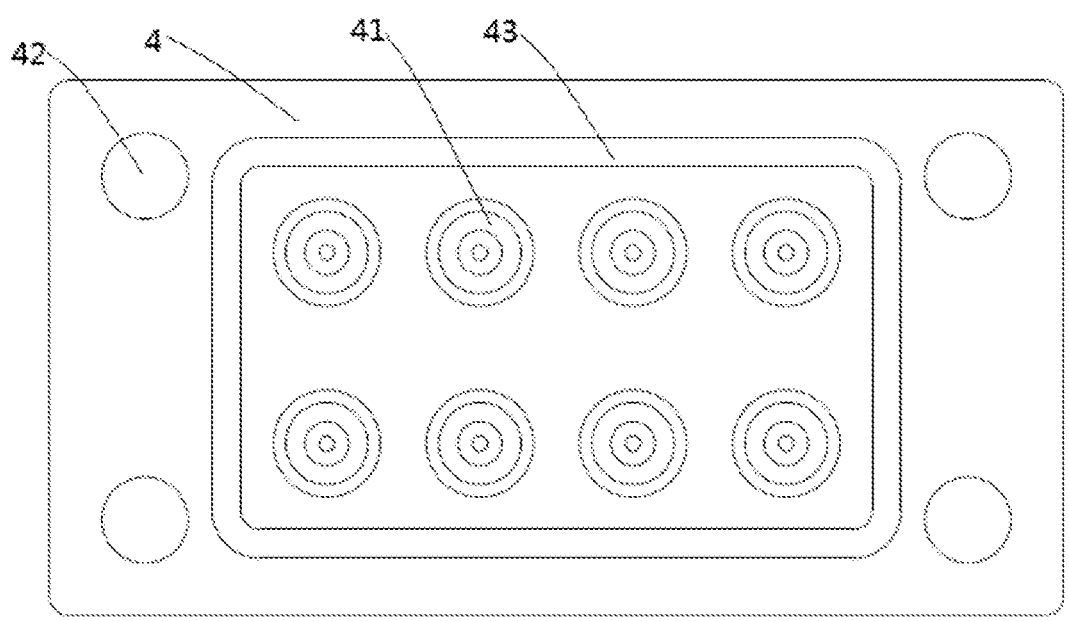

With continued reference to FIGS. 3 and 4, a cross-sectional view and a partially enlarged cross-sectional view of a cable threading component according to an embodiment of the present invention are shown. The sealing hole 41 of the sealing sheet 4 comprises a tubular portion 413 extending into the through hole 31 of the substrate 3. The inner side of the tubular portion 413 is provided with a sealing core 44, so that the sealing hole 41 is in a closed state before threading, and the sealing core 44 peels off when the cable passes through, at which point the position of the sealing core 44 is occupied by the cable so that the sealing hole 41 remains sealed. Based on this design, the threading process of the cable threading component 2 according to the embodiment of the present invention is simple. The user only needs to insert the cable into the threading hole 21 and pull the cable out from the inside of the sealing box 1 to complete the threading and installation of the cable, while maintaining the sealing performance of the sealing box 1. At the same time, the cable threading component 2 according to the embodiment can accommodate any number of cables. For example, even when only one or two cables are provided, the sealing box 1 also has sufficient sealing performance because the other sealing holes 41 remain closed.

As shown in FIG. 4, the sealing hole 41 of the sealing sheet 4 comprises an inlet end 411 that abuts the guide hole 51, a tubular portion 413 extending into the through hole 31, and a transition portion 412 between the inlet end 411 and the tubular portion 413. In some embodiments, the inner diameter of the inner wall 510 of the guide hole 51 gradually tapered toward the direction of the sealing sheet 4. Or, in alternative embodiments, the inner diameter of the guide hole 51 may also be consistent. The guide hole 51 comprises a guide portion 511 on the outer side for guiding the cable. In some embodiments, the inner diameter of the guide hole may be between 5 mm and 7 mm, and the length may be between 3 mm and 4 mm. The inlet end 411 of the sealing sheet 4 can smoothly transit from the inner side of the guide hole 51. In some embodiments, the inlet end 411 of the sealing sheet 4 can also be tapered. In some embodiments, the transition portion 412 of the sealing sheet 4 gradually tapered from the inlet end 411 to the tubular portion 413, and has a greater slope than the inlet end 411. In some embodiments, the outer diameter of the tubular portion 413 is smaller than the inner diameter of the through hole 31. For example, the outer diameter of the tubular portion 413 is 0.5 mm-1.5 mm smaller than the inner diameter of the through hole 31. As a result, there is a gap between the tubular portion 413 and the inner wall of the through hole 31, where the thickness of the gap on each side can be about 0.2 mm to 0.6 mm, which allows the tubular portion 413 to have sufficient space for deformation and to be pressed tightly between the cable and the inner wall of the through hole 31 after deformation, thus providing sufficient sealing performance. In some embodiments, the tubular portion 413 may have a length substantially equivalent to its inner diameter, e.g., greater than 80% of the inner diameter, as sufficient length of the tubular portion 413 enhances the sealing performance. In some embodiments, the length of the tubular portion 413 can be more than 2 mm. In some embodiments, the length of the tubular portion 413 may be slightly greater than the length of the through hole 31. The length of the tubular portion 413 not only helps to enhance the sealing performance, but also helps to keep the cable horizontal. In some embodiments, the through hole 31 of the substrate has a portion 310 with a uniform inner diameter and a slope 311 adjacent to the sealing sheet 4. When the cable is inserted into the sealing hole of the sealing sheet, the transition portion 412 of the sealing hole will likely partially migrate into the through hole 31 and abuts against the slope 311 of the through hole 31.

In some embodiments, the sealing core 44 comprises a central reinforcing portion 441 and an annular thinning portion 442 on the outer ring of the central reinforcing portion 441. In some embodiments, the central reinforcing portion 441 is convex or T-shaped in the cross section. The position of the central reinforcing portion 441 corresponds to the position of the metal core of the cable, so that the central reinforcing portion 441 is easily pressed against by the metal core of the cable when the cable is inserted, thereby causing the annular thinning portion 442 to split and causing the sealing core 44 to peel off.

It should be appreciated that in order to achieve sealing, the outer diameter of the cable needs to be slightly larger than the inner diameter of the tubular portion 413. For example, in some embodiments, the inner diameter of the tubular portion 413 can be 2.3 mm. At this point, provided that the outer diameter of the cable is ensured to be above 2.5 mm so that the inner diameter of the tubular portion 413 is stretched to 2.5 mm, IP66 level dust and water resistance can thus be achieved. The upper limit of the outer diameter of the cable depends on the material of the sealing sheet 4 and the inner diameter of the through hole 31. Although IP66 level waterproofing is lower than IP68 level waterproofing of the cable gland, IP68 waterproofing of the cable gland is overdesigned for most applications. In addition, compared to the cable gland, the cable threading structure of the present application is lower in cost. In some embodiments, the inner diameter of the through hole 31 can be 5 mm, and the wall thickness of the tubular portion 413 can be between 0.5 and 1.2 mm, such as 1 mm. It can receive a cable with an outer diameter of 4 mm. At this time, the inner diameter of the tubular portion 413 is stretched to 4 mm, while the wall thickness is pressed to only 0.5 mm. Therefore, in some embodiments, the tubular portion 413 of the sealing hole can provide IP66 level dust and water resistance when its inner diameter is stretched to 108% (2.5/2.3) to 170% (4/2.3) by the cable. In some embodiments, the diameter of the cable can cause the tubular portion 413 to be stretched to contact the inner wall 310 of the through hole 31, and the sidewall of the tubular portion 413 is pressed to achieve good sealing performance. In some embodiments, the sidewall of the tubular portion 413 is pressed to up to 40% of the original thickness, i.e., a sidewall is thinned from 1 mm to 0.4 mm to the maximum. In some embodiments, the sidewall of the tubular portion 413 may not be pressed, i.e., even when stretched by the cable, the outer diameter of the tubular portion 413 is still smaller than the inner diameter of the through hole 31, at which point sufficient sealing performance can still be provided.

In some embodiments, the sealing sheet 4 can be made of silicone rubber, thermoplastic polyurethane rubber, or other suitable rubber material, and the Shore A hardness of the sealing sheet can be in the range of 55° to 65°. In some embodiments, the substrate 3 and the mounting plate 5 can be made of plastic or metal materials.

With continued reference to FIG. 3 and FIGS. 5-8, in some embodiments, the sealing sheet 4 has an outer circumferential sealing ring 43 surrounding the plurality of sealing holes 41 on the side facing the substrate 3, so as to provide dual sealing. In some embodiments, the mounting plate 5 comprises an outer circumferential protrusion 502 corresponding to the outer circumferential sealing ring 43 and inner protrusions 501 surrounding the respective sealing holes 41 on the side facing the sealing sheet 4. In the assembled state, the outer circumferential protrusion 502 and the inner protrusions 501 abut against the sealing sheet 4.

The cable threading component and the sealing box according to the embodiments of the present invention provide sufficient sealing performance, is simple in structure, easy to assemble, and low in cost, and provides better applicability and universality.

The specific embodiments of the present application described above are merely intended to describe the principles of the present application more clearly, wherein various components are clearly shown or described to facilitate the understanding of the principles of the present invention. Those skilled in the art may, without departing from the scope of the present application, make various modifications or changes to the present application. Therefore, it should be understood that these modifications or changes should be included within the scope of patent protection of the present application.

What is claimed is:

1. A cable threading component, comprising:
    a substrate, comprising a plurality of through holes;
    a sealing sheet, comprising a plurality of sealing holes corresponding to positions of the through holes on the substrate; and
    a mounting plate, comprising a plurality of guide holes corresponding to positions of the through holes on the substrate;
    wherein, when the mounting plate is attached to the substrate, the sealing sheet is pressed between the substrate and the mounting plate, and the plurality of through holes of the substrate, the plurality of sealing holes of the sealing sheet, and the plurality of guide holes of the mounting plate are aligned to form threading holes, where the guide hole has an inner diameter larger than that of the through hole to allow cable to pass through the threading hole from side of the mounting plate;
    wherein, the sealing hole comprises a tubular portion extending into the through hole, and a sealing core is provided inside the tubular portion, so that the sealing hole is closed before threading, and the sealing core peels off and position of the sealing core is occupied by the cable when the cable passes through;

wherein the sealing sheet has an outer circumferential sealing ring surrounding the plurality of sealing holes on the side facing the substrate, and the mounting plate comprises an outer circumferential protrusion corresponding to the outer circumferential sealing ring and inner protrusions surrounding respective sealing holes on the side facing the sealing sheet, where the outer circumferential protrusion and the inner protrusions abut against the sealing sheet.

2. The cable threading component according to claim 1, wherein each sealing hole of the sealing sheet comprises an inlet end that abuts the through hole, a tubular portion extending into the through hole, and a transition portion between the inlet end and the tubular portion, and optionally, the transition portion gradually tapers from the inlet end to the tubular portion.

3. The cable threading component according to claim 2, wherein the plurality of threading holes comprise more than 4 threading holes, and optionally, the plurality of threading holes comprise more than 6 threading holes.

4. The cable threading component according to claim 1, wherein an outer diameter of the tubular portion is smaller than an inner diameter of the through hole, and optionally, the outer diameter of the tubular portion is 0.5 mm-1.5 mm smaller than the inner diameter of the through hole, and optionally, a length of the tubular portion is greater than 80% of the inner diameter of the tubular portion.

5. The cable threading component according to claim 1, wherein the sealing core comprises a central reinforcing portion and an annular thinning portion on an outer ring of the central reinforcing portion, and optionally, the central reinforcing portion is in a convex shape in the cross section.

6. The cable threading component according to claim 1, wherein the substrate has a recess to accommodate the sealing sheet and the mounting plate, and optionally, the mounting plate, the sealing sheet, and the substrate have bolt holes in corresponding positions, and the mounting plate is fixed to the substrate by bolts.

7. The cable threading component according to claim 1, wherein the sealing sheet is made of silicone rubber or thermoplastic polyurethane rubber, and Shore A hardness of the sealing sheet is in a range of 55° to 65°.

8. The cable threading component according to claim 1, wherein the tubular portion of the sealing hole provides IP66 level dust and water resistance when its inner diameter is stretched to 108% to 170% by a cable.

9. A sealing box, comprising the cable threading component according to claim 1.

10. A method, comprising:
providing a substrate, comprising a plurality of through holes;
providing a sealing sheet, comprising a plurality of sealing holes corresponding to positions of the through holes on the substrate; and
providing a mounting plate, comprising a plurality of guide holes corresponding to positions of the through holes on the substrate;
attaching the mounting plate to the substrate, wherein the sealing sheet is pressed between the substrate and the mounting plate, and the plurality of through holes of the substrate, the plurality of sealing holes of the sealing sheet, and the plurality of guide holes of the mounting plate are aligned to form threading holes, where the guide hole has an inner diameter larger than that of the through hole to allow cable to pass through the threading hole from side of the mounting plate;
wherein, the sealing hole comprises a tubular portion extending into the through hole, and a sealing core is provided inside the tubular portion, so that the sealing hole is closed before threading, and the sealing core peels off and position of the sealing core is occupied by the cable when the cable passes through;
wherein the sealing sheet has an outer circumferential sealing ring surrounding the plurality of sealing holes on the side facing the substrate, and the mounting plate comprises an outer circumferential protrusion corresponding to the outer circumferential sealing ring and inner protrusions surrounding respective sealing holes on the side facing the sealing sheet, where the outer circumferential protrusion and the inner protrusions abut against the sealing sheet.

11. The method according to claim 10, wherein each sealing hole of the sealing sheet comprises an inlet end that abuts the through hole, a tubular portion extending into the through hole, and a transition portion between the inlet end and the tubular portion, and wherein, the transition portion gradually tapers from the inlet end to the tubular portion.

12. The method according to claim 11, wherein the plurality of threading holes comprise more than 4 threading holes, and wherein, the plurality of threading holes comprise more than 6 threading holes.

13. The method according to claim 10, wherein an outer diameter of the tubular portion is smaller than an inner diameter of the through hole, and optionally, the outer diameter of the tubular portion is 0.5 mm-1.5 mm smaller than the inner diameter of the through hole, and wherein, a length of the tubular portion is greater than 80% of the inner diameter of the tubular portion.

14. The method according to claim 10, wherein the sealing core comprises a central reinforcing portion and an annular thinning portion on an outer ring of the central reinforcing portion, and wherein, the central reinforcing portion is in a convex shape in the cross section.

15. The method according to claim 10, wherein the substrate has a recess to accommodate the sealing sheet and the mounting plate, and optionally, the mounting plate, the sealing sheet, and the substrate have bolt holes in corresponding positions, and the mounting plate is fixed to the substrate by bolts.

16. The method according to claim 10, wherein the sealing sheet is made of silicone rubber or thermoplastic polyurethane rubber, and Shore A hardness of the sealing sheet is in a range of 55° to 65°.

17. The method according to claim 10, wherein the tubular portion of the sealing hole provides IP66 level dust and water resistance when its inner diameter is stretched to 108% to 170% by a cable.

18. The method according to claim 10, further comprising providing a sealing box comprising the cable threading component.

* * * * *